United States Patent
Kim et al.

(10) Patent No.: US 10,607,692 B2
(45) Date of Patent: Mar. 31, 2020

(54) SERIALIZER AND MEMORY DEVICE INCLUDING THE SAME

(71) Applicant: Sk hynix Inc., Gyeonggi-do (KR)

(72) Inventors: Jae-Hyeong Kim, San Ramon, CA (US); Amal Akbar, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/989,410

(22) Filed: May 25, 2018

(65) Prior Publication Data

US 2019/0006002 A1 Jan. 3, 2019

Related U.S. Application Data

(60) Provisional application No. 62/526,654, filed on Jun. 29, 2017.

(51) Int. Cl.

| | | |
|---|---|---|
| *G11C 11/41* | (2006.01) | |
| *G11C 11/419* | (2006.01) | |
| *G11C 11/417* | (2006.01) | |
| *G11C 11/4091* | (2006.01) | |
| *G11C 16/08* | (2006.01) | |
| *G11C 11/408* | (2006.01) | |
| *G11C 16/26* | (2006.01) | |
| *G11C 7/10* | (2006.01) | |
| *G11C 16/04* | (2006.01) | |
| *G11C 8/16* | (2006.01) | |

(52) U.S. Cl.
CPC ............ *G11C 11/419* (2013.01); *G11C 7/103* (2013.01); *G11C 7/106* (2013.01); *G11C 7/1039* (2013.01); *G11C 11/4085* (2013.01); *G11C 11/4091* (2013.01); *G11C 11/417* (2013.01); *G11C 16/08* (2013.01); *G11C 16/26* (2013.01); *G11C 8/16* (2013.01); *G11C 16/0483* (2013.01); *G11C 2207/107* (2013.01)

(58) Field of Classification Search
CPC ....... G11C 7/1051; G11C 8/16; G11C 11/408; G11C 11/4091; G11C 11/4093; G11C 11/417; G11C 11/418; G11C 11/419; G11C 16/08; G11C 16/26; G11C 11/4085; G11C 16/0483
USPC .... 365/154, 189.02, 189.05, 189.15, 189.16, 365/230.02
See application file for complete search history.

(56) References Cited

U.S. PATENT DOCUMENTS

| | | | | |
|---|---|---|---|---|
| 4,970,690 A | * | 11/1990 | Sherman | G11C 11/21 365/189.02 |
| 5,831,924 A | * | 11/1998 | Nitta | G11C 7/18 365/189.17 |
| 6,337,826 B1 | * | 1/2002 | Imai | G11C 7/1006 365/219 |
| 7,426,144 B2 | * | 9/2008 | Fujisawa | G11C 7/1012 365/189.02 |
| 8,284,602 B2 | | 10/2012 | Shin | |

(Continued)

FOREIGN PATENT DOCUMENTS

KR 100551028 2/2006

*Primary Examiner* — Tan T. Nguyen
(74) *Attorney, Agent, or Firm* — IP & T Group LLP

(57) ABSTRACT

A data output device includes: a plurality of storage devices coupled in parallel to store input data, and having a storage region with a predetermined depth; and a selector suitable for selecting an output of any one storage device among the plurality of storage devices.

13 Claims, 13 Drawing Sheets

(56) References Cited

U.S. PATENT DOCUMENTS

| | | | | |
|---|---|---|---|---|
| 2003/0095442 A1* | 5/2003 | Lee | ............... | G11C 7/1012 365/189.02 |
| 2005/0135160 A1* | 6/2005 | Kim | ............... | G11C 7/1006 365/189.05 |
| 2008/0151648 A1* | 6/2008 | Eilert | ............ | G06F 13/4239 365/189.02 |
| 2010/0329014 A1* | 12/2010 | Lim | ............... | G11C 11/5642 365/185.18 |
| 2011/0292744 A1* | 12/2011 | Lee | ............... | G11C 7/1042 365/189.15 |
| 2015/0279435 A1* | 10/2015 | Hsiao | ............ | G11C 7/1057 365/189.05 |
| 2017/0292995 A1* | 10/2017 | Semenov | ...... | G01R 31/31701 |

* cited by examiner

SERIALIZER AND MEMORY DEVICE INCLUDING THE SAME

CROSS-REFERENCE TO RELATED APPLICATION

This application claims priority to U.S. Provisional Patent Application No. 62/526,654 entitled, "PIPE LATCH ARCHITECTURE FOR NAND MEMORY SYSTEM", filed on Jun. 29, 2017, which is incorporated herein by reference in its entirety.

BACKGROUND

1. Field

Exemplary embodiments relate to a serializer used in a memory device.

2. Discussion of the Related Art

Electronic devices such as a computer, mobile phone and storage device may include integrated circuits (ICs) having various elements or circuits integrated therein. Each of the integrated circuits may be coupled to one or more external circuits or devices, and include components for interfacing with the external circuits or devices. For example, a peripheral device such as a memory device may be coupled to a memory controller, thereby constituting a memory system.

In general, various signals such as data, addresses and commands may be transmitted/received between the memory device and the memory controller in the memory system. Therefore, various operations such as program, read and erase operations may be performed on the memory device.

A memory device may include a serializer which reads parallel data stored in a memory cell array, converts the read data into serial data, and outputs the serial data, and a deserializer which performs the reverse operation to the serializer.

SUMMARY

Various embodiments are directed to a serializer and a memory device including the same.

Also, various embodiments are directed to a serializer which converts parallel data outputted from a memory cell array into serial data, and outputs the serial data.

In an embodiment, a data output device may include: a plurality of storage devices coupled in parallel to store input data, and having a storage region with a predetermined depth; and a selector suitable for selecting an output of any one storage device among the plurality of storage devices.

In an embodiment, a memory device may include: a plurality of memory banks for storing data; a first serializer suitable for receiving first parallel data having a first size from a first data line coupled to one memory bank, and selectively outputting first and second serial data each having a second size corresponding to ½ of the first size; a second serializer suitable for receiving second parallel data having the first size from a second data line coupled to another memory bank, and selectively outputting third and fourth serial data each having the second size; and a latch circuit suitable for latching the output of the first serializer and the output of the second serializer, and outputting serial output data having the first size. The first serializer comprises two or more first-in first-out (FIFO) circuit, each including: a plurality of storage devices coupled in parallel to store input data, and having a storage region with a predetermined depth; and a selector suitable for selecting an output of any one storage device among the plurality of storage devices.

DETAILED DESCRIPTION

Figure 1A:
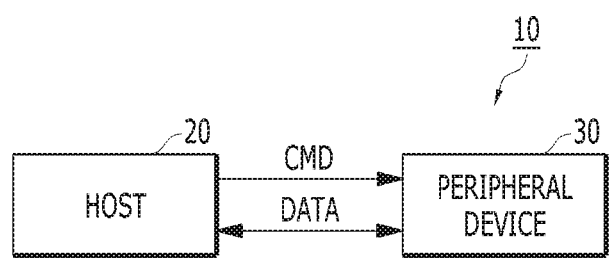
FIGS. 1A and 1B are block diagrams illustrating a data processing system.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1B:
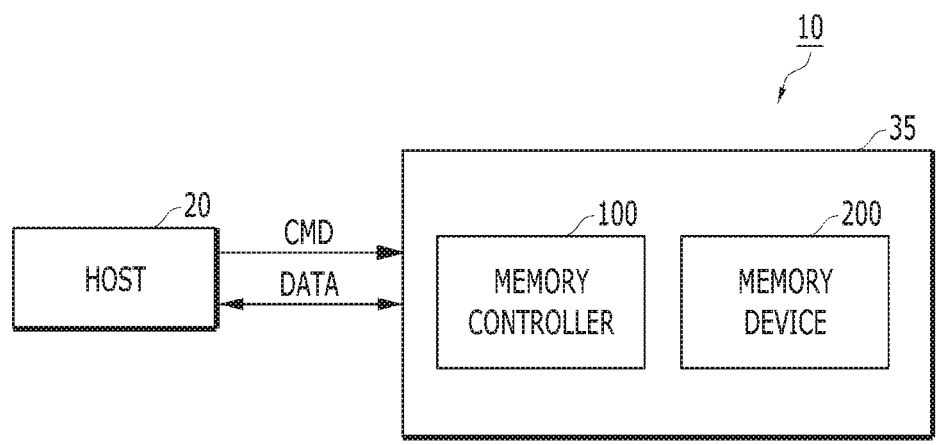

FIGS. 1A and 1B illustrate a data processing system.

Referring to FIG. 1A, the data processing system 10 may include a host 20 and a peripheral device 30. The peripheral device 30 may receive a command CMD (or request) from a host 20, and exchange data DATA with the host 20 according to the received command. For example, the host 20 may include a computer, a server, a smart phone and the like, and the peripheral device 30 may include a mobile or storage product.

Referring to FIG. 1B, the peripheral device 30 illustrated in FIG. 1A may be implemented by a memory system 35. That is, a data processing system 10 may include the host 20 and the memory system 35. The host 20 may include portable electronic devices such as a mobile phone, MP3 player and laptop computer or electronic devices such as a desktop computer, game machine, TV and projector.

The memory system 35 may be accessed in response to a command from the host 20. In other words, the memory system 35 may be used as a main memory device or auxiliary memory device of the host 20.

The memory system 35 may include a memory controller 100 and a memory device 200. The memory controller 100 may perform an access operation on the memory device 200 in response to the command from the host 20. For example, the memory controller 100 may store write data from the host 20 in the memory device 200 in response to a write command from the host 20. For another example, the memory controller 100 may read data stored in the memory device 200 in response to a read command from the host 20, and transfer the read data to the host 20. In various embodiments, the memory device 200 may include volatile memory devices such as a dynamic random access memory (DRAM) and static RAM (SRAM). In other embodiments, the memory device 200 may include nonvolatile memory devices such as a read only memory (ROM), mask ROM (MROM), programmable ROM (PROM), erasable ROM (EPROM), electrically erasable ROM (EEPROM), ferromagnetic RAM (FRAM), phase change RAM (PRAM), magnetic RAM (MRAM), resistive RAM (RRAM) and flash memory.

Figure 2:
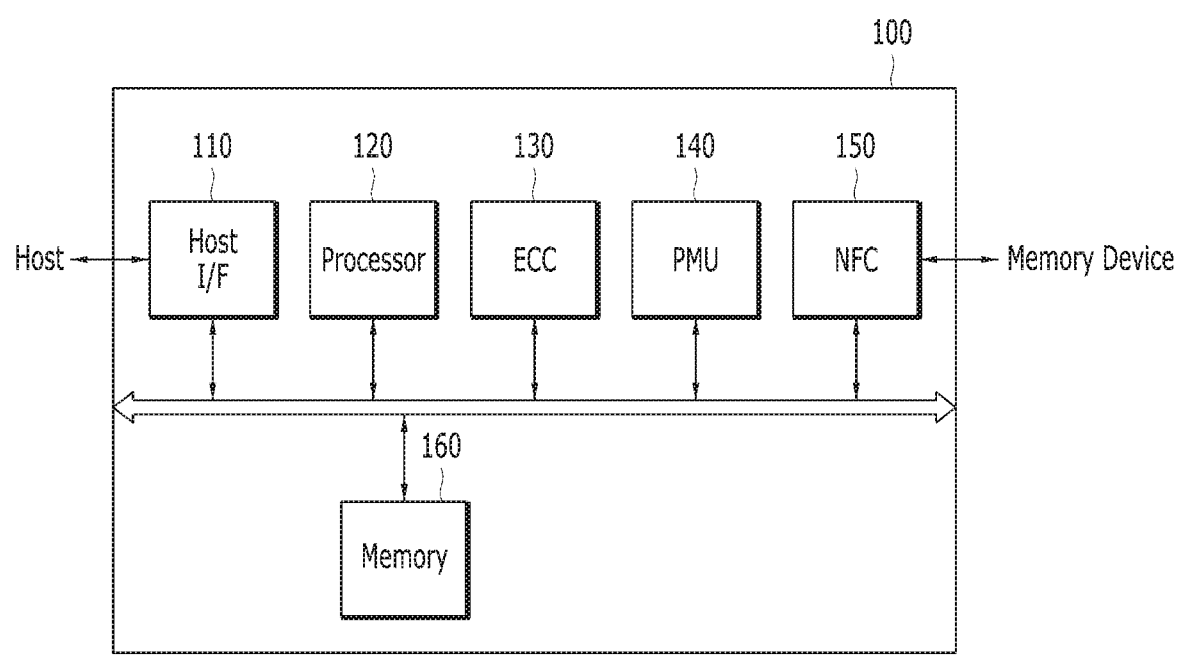
FIG. 2 is a block diagram illustrating a memory controller.

FIG. 2 illustrates an example of the memory controller. For example, FIG. 2 illustrates the configuration of the memory controller 100 illustrated in FIG. 1B.

Referring to FIG. 2, the memory controller 100 may include a host interface (I/F) circuit 110, a processor 120, an error correction code (ECC) circuit 130, a power management unit (PMU) 140, a memory interface (I/F) circuit 150 and a memory 160.

The host I/F circuit 110 may process a command and data which are received from the host 20. The host I/F circuit 110 may be configured to enable the memory controller 100 to communicate with the host 20 through one or more of various interface protocols.

The ECC circuit 130 may detect and correct an error contained in data read from a memory device, for example, the memory device 200 illustrated in FIG. 1B. The PMU 140 may provide power to components included in the memory controller 100, and manage the power provided to the components.

The memory I/F circuit 150 may perform interfacing between the memory controller 100 and the memory device 200. Specifically, the memory I/F circuit 150 may process a command and data between the memory controller 100 and the memory device 200 according to control of the processor 120. For example, the memory I/F circuit 150 may transfer write data from the host 20 to the memory device 200 in response to a write command from the host 20, such that the data are stored in the memory device 200. For another example, the memory I/F circuit 150 may receive data read from the memory device 200 in response to a read command from the host 20, and transfer the read data to the host 20.

The memory 160 may serve as a working memory of the memory system 35 and the memory controller 100, and store data related to the operations of the memory system 35 and the memory controller 100. For example, the memory 160 may store program data required for performing a data write operation and/or read operation between the host 20 and the memory device 200, and store write data and/or read data. The memory 160 may be implemented with a volatile memory such as SRAM or DRAM.

The processor 120 may control overall operations of the memory system 35. For example, the processor 120 may control a write operation and/or read operation on the memory device 200 in response to a write request or read request from the host 20.

Figure 3:
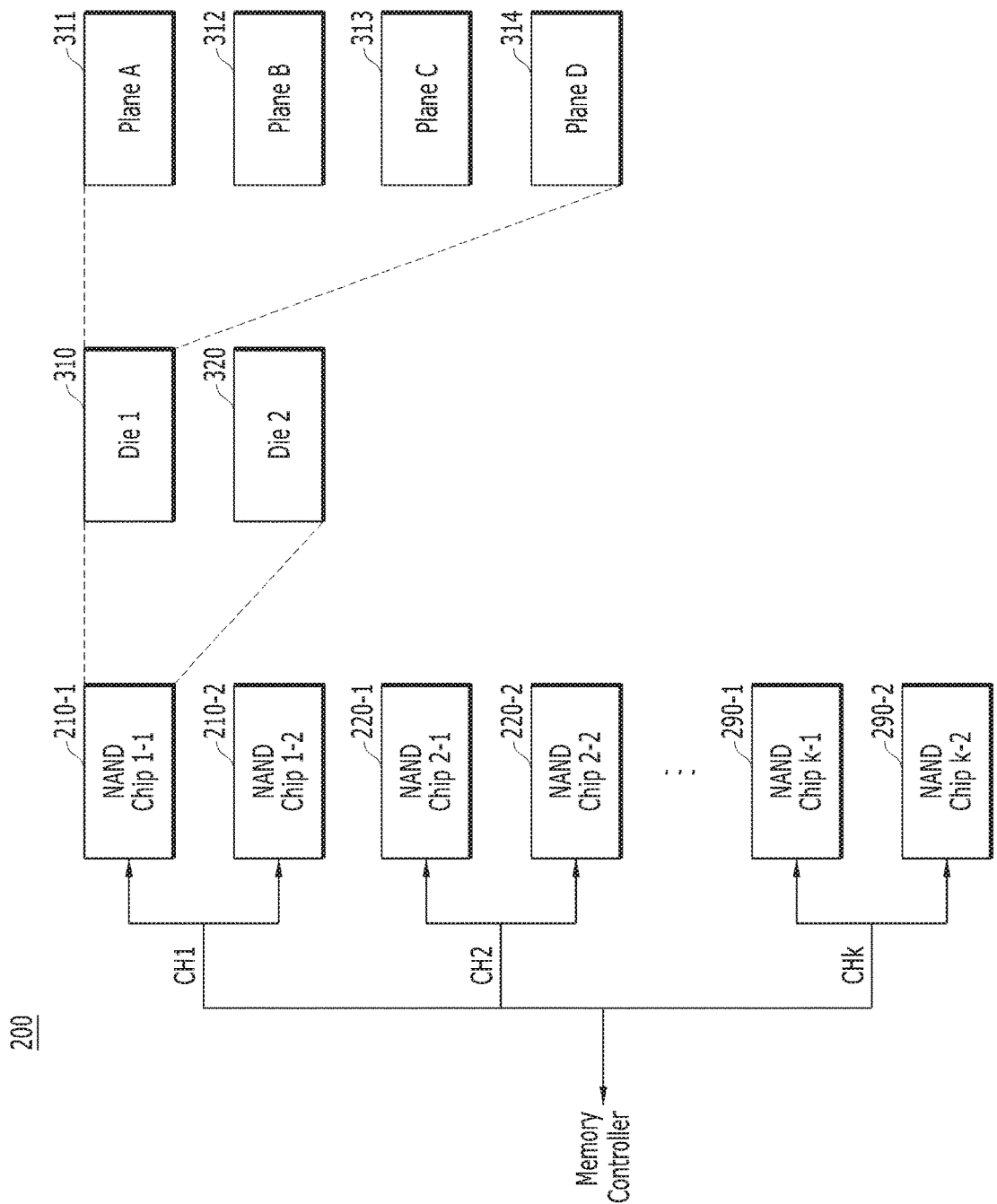
FIG. 3 is a block diagram illustrating the hierarchical structure of a memory device.

FIG. 3 illustrates the hierarchical structure of a memory device. For example, FIG. 3 illustrates the configuration of a nonvolatile memory device such as a NAND-type flash memory which can be used as the memory device 200 illustrated in FIG. 1B.

Referring to FIG. 3, the memory device 200 may include a plurality of NAND chips 210-1 and 220-1, 220-1 and 220-2, . . . , and 290-1 and 290-2. The plurality of NAND chips 210-1 and 220-1, 220-1 and 220-2, . . . , and 290-1 and 290-2 may be coupled to a memory controller, for example, the memory controller 100 illustrated in FIG. 1B through a plurality of channels CH1, CH2, . . . , CHk. The NAND chips 210-1 and 210-2 may be coupled to the memory controller 100 through the channel CH1, the NAND chips 220-1 and 220-2 may be coupled to the memory controller 100 through the channel CH2, and the NAND chips 290-1 and 290-2 may be connected to the memory controller 100 through the channel CHk.

The NAND chip 210-1 may include a plurality of memory dies, for example, two memory dies 310 and 320. The memory die 310 may include a plurality of memory planes 311 to 314. Each of the memory planes may include a plurality of memory blocks (not illustrated), and each of the blocks may include a plurality of memory pages (not illustrated).

For example, the memory die 310 may include two memory planes. Each memory plane may include 1024 blocks, and each of the blocks may include 512 pages.

Figure 4:
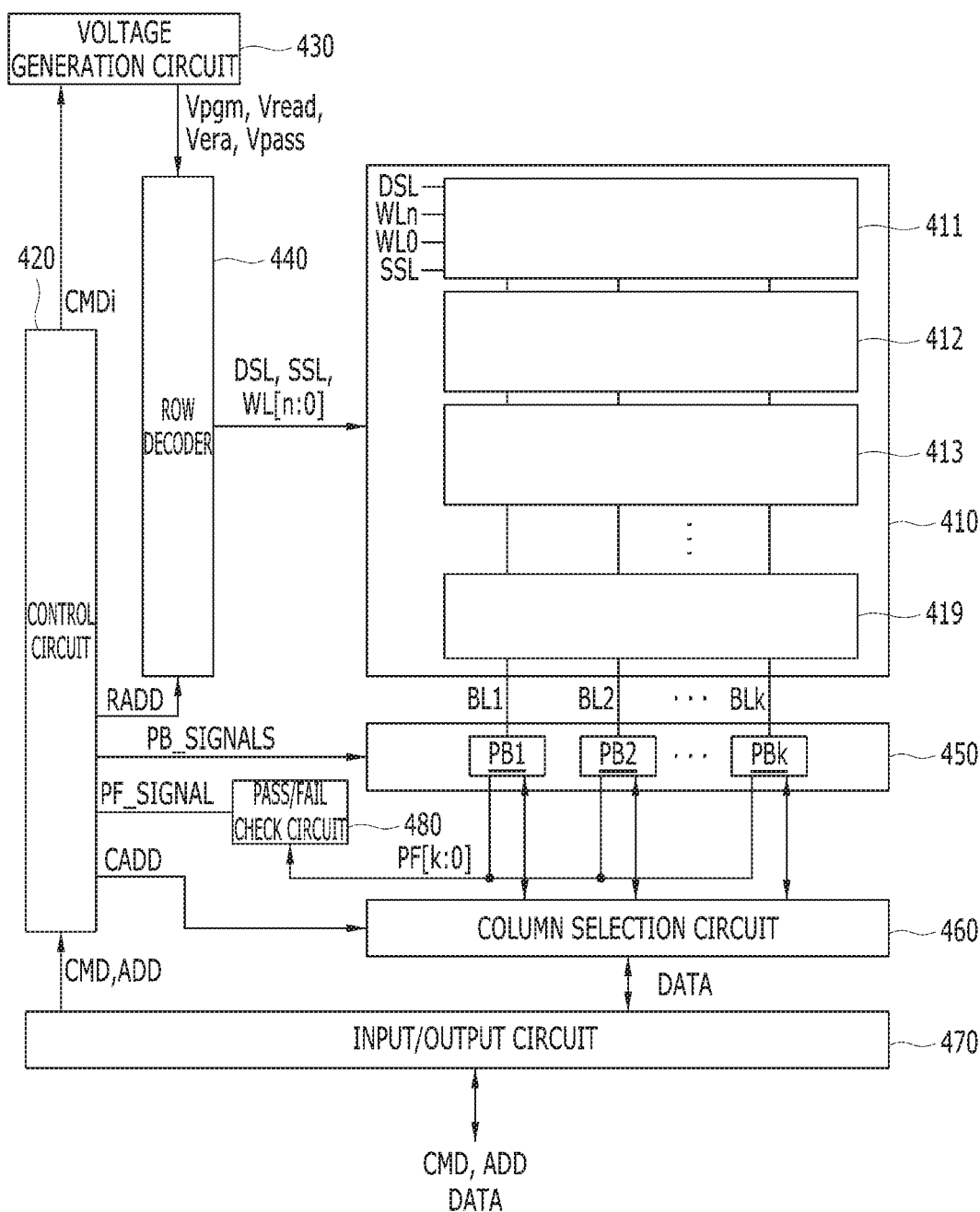
FIG. 4 is a block diagram illustrating a memory die.
Figure 5:
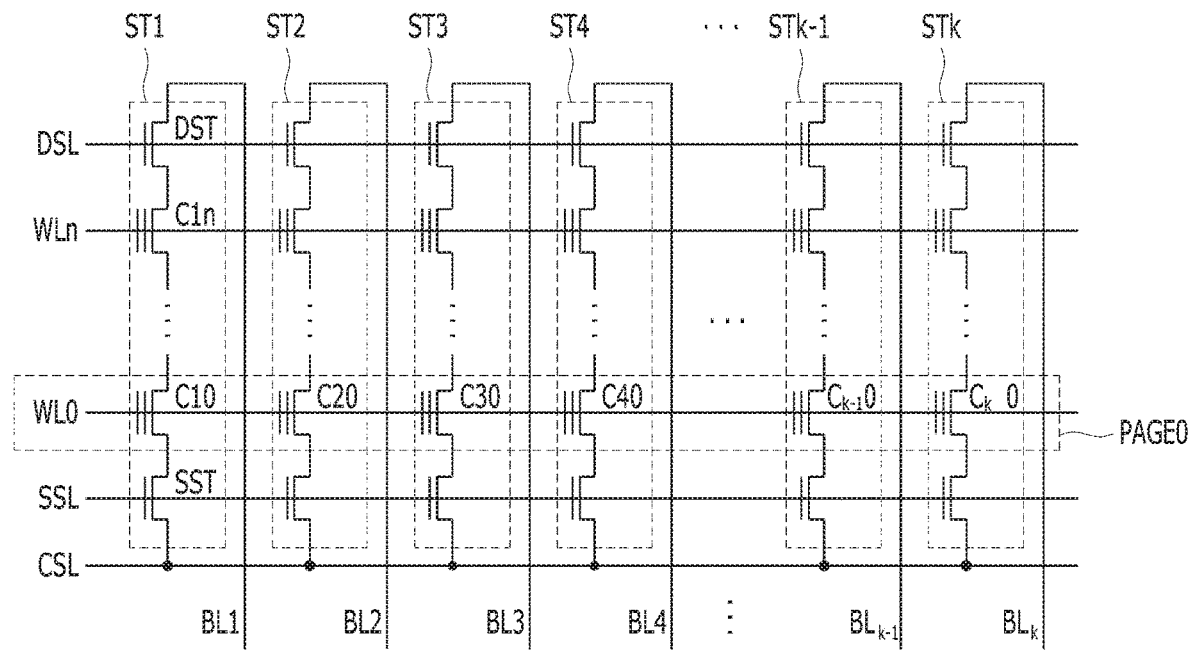
FIG. 5 is a schematic circuit diagram illustrating a memory block.

FIG. 4 illustrates a memory die, and FIG. 5 illustrates a memory block. For example, FIG. 4 illustrates the configuration of the memory die 310 illustrated in FIG. 3.

Referring to FIG. 4, the memory die 310 may include a memory cell array 410 including a plurality of memory blocks 411 to 419, a voltage generation circuit 430, a row decoder 440, a page buffer group 450, a column selection circuit 460, an input/output circuit 470, a pass/fail check circuit 480 and a control circuit 420. The voltage generation circuit 430, the row decoder 440, the page buffer group 450, the column selection circuit 460, the input/output circuit 470 and the pass/fail check circuit 480 may be configured to a program operation, read operation and test operation on memory cells included in a page selected from the memory blocks 411 to 419, and the control circuit 420 may control the circuit elements 430 to 480.

In the case of a NAND flash memory device, operation circuits may include the voltage generation circuit 430 serving as a voltage supply circuit, the row decoder 440, the page buffer group 450, the column selection circuit 460, the input/output circuit 470 and the pass/fail check circuit 480. The memory cell array 410 may include a plurality of memory blocks 411 to 419.

FIG. 4 illustrates that the memory die 310 includes components corresponding to a single plane. However, the memory die 310 may include components corresponding to each of a plurality of planes. For example, when the memory die 310 includes two planes, the memory die 310 may include two voltage generation circuits, two row decoders, two-page buffer groups, two column selection circuits, two input/output circuits and two pass/fail check circuits.

Referring to FIG. 5, the memory block may include a plurality of strings ST1 to STk coupled between the bit lines BL1 to BLk and a common source line CSL. That is, the strings ST1 to STk may be coupled to the corresponding bit lines BL1 to BLk, and coupled to the common source line CSL in common. The string ST1 may include a source select transistor SST having a source coupled to the common source line CSL, a plurality of memory cells C10 to C1n, and a drain select transistor DST having a drain coupled to the bit line BL1. The memory cells C10 to C1n may be coupled in series between the source select transistor SST and the drain select transistor DST. The gate of the source select transistor SST may be coupled to a source select line SSL, the gates of the memory cells C10 to C1n may be coupled to word lines WL0 to WLn, respectively, and the gate of the drain select transistor DST may be coupled to a drain select line DSL.

In a NAND flash memory device, memory cells included in a memory block may be divided by the physical page or logical page. For example, the memory cells C10 to Ck0 coupled to one word line WL0 may constitute one physical page PAGE0. Even-numbered memory cells Ce10 to Cek0 coupled to one word line WL0 may constitute one even physical page, and odd-numbered memory cells Co10 to Cok0 may constitute one odd physical page. Such a page may be set to the basic unit of a program or read operation. In the present embodiment, the case in which memory cells coupled to one word line constitute one physical page will be taken as an example for description.

Referring back to FIGS. 4 to 5, the control circuit 420 may output an internal command signal CMDi for performing a program operation, read operation or test operation in response to a command signal CMD inputted from outside through the input/output circuit 470, and output PB control signals PB_SIGNALS for controlling page buffers PB1 to PBk included in the page buffer group 450 depending on the type of an operation. Furthermore, the control circuit 420 may output a row address signal RADD and a column address signal CADD in response to an address signal ADD inputted from outside through the input/output circuit 470.

The voltage generation circuit 430 and the row decoder 440 which serve as a voltage supply circuit may supply operation voltages for memory cells to a selected memory cell block in response to the internal command signal CMDi from the control circuit 420. The voltage generation circuit 430 may output operation voltages (for example, Vpgm, Vread and Vpass) required for program, read and test operations of the memory cells to global lines in response to the internal command signal CMDi from the control circuit 420. For the program operation, the voltage generation circuit 430 may output the program voltage Vpgm and the pass voltage Vpass to the global lines, such that the program voltage Vpgm is applied to memory cells of a selected page and the pass voltage Vpass is applied to unselected memory cells. For the read operation, the voltage generation circuit 430 may output the read voltage Vread and the pass voltage Vpass to the global lines, such that the program voltage Vread is applied to memory cells of a selected page and the pass voltage Vpass is applied to unselected memory cells. During the test operation related to data storage, the voltage generation circuit 430 may output the program voltage Vpgm and the pass voltage Vpass as in the program operation. During the test operation related to data read, the voltage generation circuit 430 may output the read voltage Vread and the pass voltage Vpass as in the read operation.

The row decoder 440 may couple the global lines to the local lines DSL, WL0 to WLn and SSL in response to the row address signals RADD from the control circuit 420, such that the operation voltages outputted to the global lines from the voltage generation circuit 430 can be transferred to the local lines DSL, WL0 to WLn and SSL of the memory blocks 411 to 419 selected from the memory cell array 410. Therefore, the program voltage Vpgm or the read voltage Vread may be applied to a local word line (for example, WL0) coupled to a selected cell (for example, C01) from the voltage generation circuit 430 through a global word line. On the other hand, the pass voltage Vpass may be applied to the local word lines (for example, WL1 to WLn) coupled to the unselected cells C11 to Cn1 from the voltage generation circuit 430 through the global word lines. During an erase operation, an erase voltage Vera may be applied to the whole memory cells in a block. Therefore, data may be stored in the selected cell C01 by the program voltage Vpgm, or data stored in the selected cell C01 may be read by the read voltage Vread.

The page buffer group 450 may include the plurality of page buffers PB1 to PBk coupled to the memory cell array 410 through the bit lines BL1 to BLk. In response to the PB control signal PB_SIGNALS from the control circuit 420, the page buffers PB1 to PBk of the page buffer group 450 may selectively precharge the bit lines BL1 to BLk depending on input data in order to store the data in the memory cells C10 to Ck0, or sense the voltages of the bit lines BL1 to BLk in order to read data from the memory cells C10 to Ck0.

For example, when program data (for example, data '0') is inputted to the page buffer PB1 to store the program data in the memory cell C01, the page buffer PB1 may apply a program permission voltage (for example, ground voltage) to the bit line BL1 of the memory cell C01 in which the program data is to be stored, during a program operation. As a result, the threshold voltage of the memory cell C01 may be raised by the program voltage Vpgm applied to the word line WL0 and the program permission voltage applied to the bit line BL1 during the program operation. Furthermore, when erase data (for example, data '1') is inputted to the page buffer PB1 in order to store the erase data in the memory cell C01, the page buffer PB1 may apply a program inhibition voltage (for example, supply voltage) to the bit line BL1 of the memory cell C01 in which the erase data is to be stored, during a program operation. As a result, although the program voltage Vpgm is applied to the word line WL0 during the program operation, a rise of the threshold voltage of the memory cell C01 may be inhibited by the program inhibition voltage applied to the bit line BL1. As the memory cell has different threshold voltages, different data may be stored in the memory cell.

During a read operation, the page buffer group 450 may precharge all of the selected bit lines (for example, BL1 to BLk). When the read voltage Vread is applied to the selected word line WL0 from the voltage generation circuit 430 and the row decoder 440, the bit lines of memory cells having program data stored therein may maintain the precharged state, and the bit lines of memory cells having erase data stored therein may be discharged. The page buffer group 450 may sense the voltage changes of the bit lines BL1 to BLk, and latch the data of the memory cells corresponding to the sensing result.

The column selection circuit 460 may select the page buffers PB1 to PBk included in the page buffer group 450 in response to a column address signal CADD outputted from the control circuit 420. That is, the column selection circuit 460 may sequentially transfer data to the page buffers PB1 to PBk in response to the column address signal CADD, in order to store the data in memory cells. Furthermore, the column selection circuit 460 may sequentially select the page buffers PB1 to PBk in response to the column address signal CADD, such that data of memory cells, latched in the page buffers PB1 to PBk, can be outputted to the outside through a read operation.

The input/output circuit 470 may transfer data to the column selection circuit 460 according to control of the control circuit 420, in order to input the data to the page buffer group 450, the data being inputted from outside so as to be stored in memory cells during a program operation. When the column selection circuit 460 transfers the data from the input/output circuit 470 to the page buffers PB1 to PBk of the page buffer group 450 according to the above-described method, the page buffers PB1 to PBk may store the data in latch circuits thereof. Furthermore, during a read operation, the input/output circuit 470 may output data to the outside, the data being transferred through the column selection circuit 460 from the page buffers PB1 to PBk of the page buffer group 450.

The pass/fail check circuit 480 may output a pass/fail signal PF_SIGNAL in response to comparison result signals PF[1] to PF[k] outputted from the respective page buffers PB1 to PBk during a program verification operation which is performed after the program operation. Specifically, during the program verification operation, the pass/fail check circuit 480 may compare the threshold voltages of memory cells to a target voltage, and latch the result values in the internal latch circuits of the page buffers PB1 to PBk. The latched comparison result signals PF[1] to PF[k] may be outputted to the pass/fail check circuit 480. The pass/fail check circuit 480 may output the pass/fail signal PF_SIGNAL to the control circuit 420 in response to the comparison result signals PF[1] to PF[k], the pass/fail signal PF_SIGNAL indicating whether the program operation has been completed. The control circuit 420 may determine whether there is a memory cell of which the threshold voltage is lower than the target voltage, among the memory cells having program data stored therein, in response to the pass/fail signal PF_SIGNAL. According to the determination result, the control circuit 420 may decide whether to perform the program operation again.

The above-described memory device may include a serializer which reads parallel data stored in the memory cell array 410, converts the read data into serial data, and outputs the serial data, and a deserializer which performs the reverse operation to the serializer. The serializer may be included in a data output path of the memory device, and deserializer may be included in a data input path of the memory device.

Figure 6:
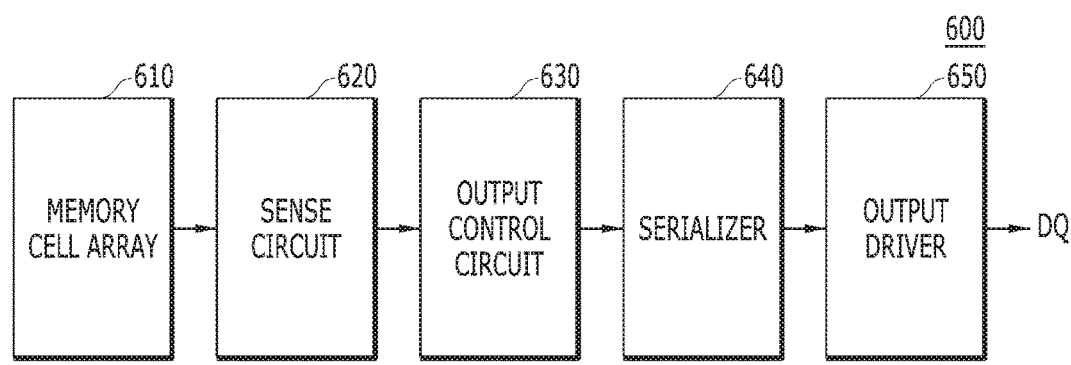
FIG. 6 is a block diagram illustrating a data output device of a memory device.

FIG. 6 illustrates a data output device 600 of a memory device.

Referring to FIG. 6, the data output device 600 may include a memory cell array 610, a sense circuit 620, an output control circuit 630, a serializer 640 and an output driver 650. For example, the data output device 600 may serve as a data output device for a volatile memory such as a dynamic random access memory (DRAM) or a data output device for a nonvolatile memory such as a flash memory.

The memory cell array 610 may include a plurality of memory cells as components for storing data. When the data output device 600 is a DRAM, the memory cell array 610 may include a plurality of word lines and bit lines crossing each other and a plurality of memory banks.

The sense circuit 620 may sense the voltages of specific bit lines in order to read data stored in a specific region of the memory cell array 610. The output control circuit 630 may output read data which are data sensed by the sense circuit 620. The output control circuit 630 may output read data having a predetermined size through a specific data line. For example, the output control circuit 630 may output 16-bit parallel data through a global data line.

The serializer 640 may receive the parallel data from the output control circuit 630, convert the received parallel data into serial data, and output the serial data. For example, the serializer 640 may convert the 16-bit parallel data into upper 8-bit serial data and lower 8-bit serial data, and output the serial data.

The output driver 650 may receive the serial data from the serializer 640, and drive a data pad DQ to output the received serial data. For example, the output driver 650 may sequentially arrange the upper 8-bit serial data and the lower 8-bit serial data, which are received from the serializer 640, and output the arranged 16-bit serial data to the data pad DQ.

Figure 7:
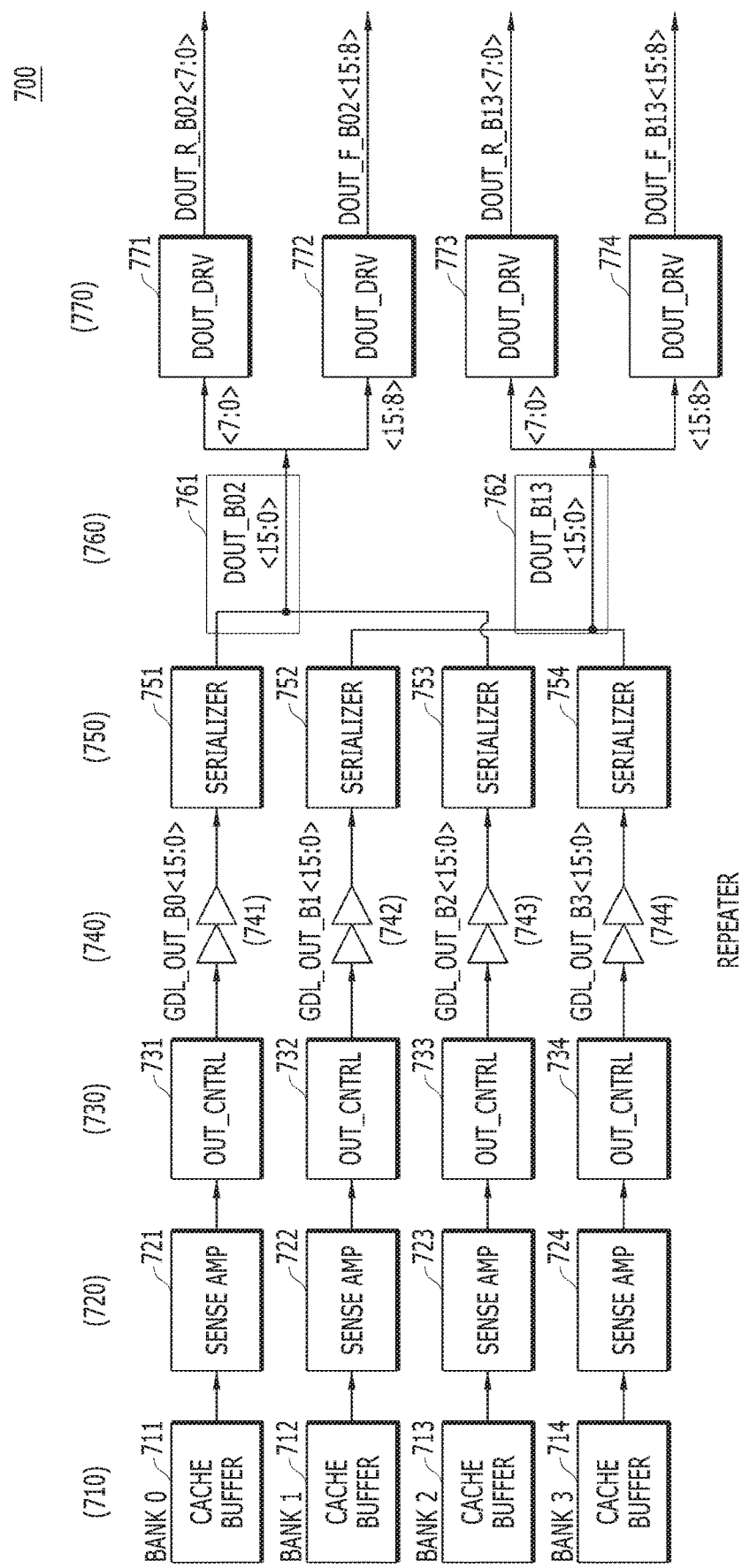
FIG. 7 is a schematic block diagram illustrating a data output device of a memory device in accordance with an embodiment.

FIG. 7 illustrates a data output device 700 of a memory device in accordance with an embodiment.

Referring to FIG. 7, the data output device 700 may read data stored in a plurality of memory banks (for example, four memory banks), and output the read data. For this operation, the data output device 700 may include memory banks 710, sense circuits 720, output control circuits 730, serializers 750, latch circuits 760 and output drivers 770. However, the data output device 700 is not limited to such a configuration. The data output device 700 may further include global data repeaters 740 coupled between the output control circuits 730 and the serializers 750.

Specifically, the data output device 700 may include a cache buffer 711, a sense amplifier 721, an output control circuit 731, a repeater 741 and a serializer 751, which are components for reading data stored in a memory bank 0 as a first memory bank and outputting the read data. The data output device 700 may include a cache buffer 712, a sense amplifier 722, an output control circuit 732, a repeater 742 and a serializer 752, which are components for reading data stored in a memory bank 1 as a second memory bank and outputting the read data. The data output device 700 may include a cache buffer 713, a sense amplifier 723, an output control circuit 733, a repeater 743 and a serializer 753, which are components for reading data stored in a memory bank 2 as a third memory bank and outputting the read data. The data output device 700 may include a cache buffer 714, a sense amplifier 724, an output control circuit 734, a repeater 744 and a serializer 754, which are components for reading data stored in a memory bank 3 as a fourth memory bank and outputting the read data. However, the data output device 700 is not limited to the above-described configuration.

The sense amplifier 721 may sense the voltages of specific bit lines in order to read data stored in the cache buffer 711 of the memory bank 0. The output control circuit 731 may output read data which are the data sensed by the sense amplifier 721. The output control circuit 731 may control the read data to output data having a predetermined size through a specific data line. For example, the output control circuit 731 may output 16-bit parallel data GDL_OUT_B0<15:0> through a global data line. The repeater 741 may relay the read data outputted from the output control circuit 731 on the specific data line, and provide the read data to the serializer 751. The serializer 751 may receive the parallel data from the output control circuit 731 through the repeater 741, convert the received parallel data into serial data, and output the serial data. For example, the serializer 751 may receive parallel data having a first size (for example, 16 bits), convert the received parallel data into upper and lower serial data, each of which have a second size (for example, 8 bits) corresponding to ½ of the first size, and selectively output the upper and lower serial data. That is, the serializer 751 may convert 8N-size data into 4N-size data, and output the 4N-size data.

The sense amplifier 722 may sense the voltages of specific bit lines in order to read data stored in the cache buffer 712 of the memory bank 1. The output control circuit 732 may output read data which are the data sensed by the sense amplifier 722. The output control circuit 732 may control the read data to output data having a predetermined size through a specific data line. For example, the output control circuit 732 may output 16-bit parallel data GDL_OUT_B1<15:0> through the global data line. The repeater 742 may relay the read data outputted from the output control circuit 732 on the specific data line, and provide the read data to the serializer 752. The serializer 752 may receive the parallel data from the output control circuit 732 through the repeater 742, convert the received parallel data into serial data, and output the serial data. For example, the serializer 752 may receive parallel data having the first size (for example, 16 bits), convert the received parallel data into upper and lower serial data, each of which have the second size (8 bits) corresponding to ½ of the first size, and selectively output the upper and lower serial data. That is, the serializer 752 may convert 8N-size data into 4N-size data, and output the 4N-size data.

The sense amplifier 723 may sense the voltages of specific bit lines in order to read data stored in the cache buffer 713 of the memory bank 2. The output control circuit 733 may output read data which are the data sensed by the sense amplifier 723. The output control circuit 733 may control the read data to output data having a predetermined size through a specific data line. For example, the output control circuit 733 may output 16-bit parallel data GDL_OUT_B2<15:0> through the global data line. The repeater 743 may relay the read data outputted from the output control circuit 733 on the specific data line, and provide the read data to the serializer 753. The serializer 753 may receive the parallel data from the output control circuit 733 through the repeater 743, convert the received parallel data into serial data, and output the serial data. For example, the serializer 753 may receive parallel data having the first size (for example, 16 bits), convert the received parallel data into upper and lower serial data, each of which have the second size (8 bits) corresponding to ½ of the first size, and selectively output the upper and lower serial data. That is, the serializer 753 may convert 8N-size data into 4N-size data, and output the 4N-size data.

The sense amplifier 724 may sense the voltages of specific bit lines in order to read data stored in the cache buffer 714 of the memory bank 3. The output control circuit 734 may output read data which are the data sensed by the sense amplifier 724. The output control circuit 734 may control the read data to output data having a predetermined size through a specific data line. For example, the output control circuit 734 may output 16-bit parallel data GDL_OUT_B3<15:0> through the global data line. The repeater 744 may relay the read data outputted from the output control circuit 734 on the specific data line, and provide the read data to the serializer 754. The serializer 754 may receive parallel data from the output control circuit 734 through the repeater 744, convert the received parallel data into serial data, and output the serial data. For example, the serializer 754 may receive parallel data having the first size (for example, 16 bits), convert the received parallel data into upper and lower serial data, each of which have the second size (8 bits) corresponding to ½ of the first size, and selectively output the upper and lower serial data. That is, the serializer 754 may convert 8N-size data into 4N-size data, and output the 4N-size data.

The latch circuits 760 may include a first latch circuit 761 and a second latch circuit 762. The first latch circuit 761 may latch the output of the first serializer 751 and the output of the third serializer 753, and output first-size first serial output data. For example, the first latch circuit 761 may receive and latch data DOUT_B0<7:0> and DOUT_B0<15:8> which are selectively outputted from the first serializer 751, receive and latch data DOUT_B2<7:0> and DOUT_B2<15:8> which are selectively outputted from the third serializer 753, and output the first-size first serial output data DOUT_B02<15:0>.

The second latch circuit 762 may latch the output of the second serializer 752 and the output of the fourth serializer 754, and output first-size second serial output data. For example, the second latch circuit 762 may receive and latch data DOUT_B1<7:0> and DOUT_B1<15:8> which are selectively outputted from the second serializer 752, receive and latch data DOUT_B3<7:0> and DOUT_B3<15:8> which are selectively outputted from the fourth serializer 754, and output the first-size second serial output data DOUT_B13<15:0>.

Among the first serial output data DOUT_B02<15:0> outputted from the first latch circuit 761, the lower data <7:0> and the upper data <15:8> may be outputted to an output terminal through first and second drivers 771 and 772 of the output drivers 770, respectively. The first driver 771 may synchronize the lower data <7:0> and drive the output terminal (for example, a data pad DQ) to output the synchronized data at a first time point, and the second driver 772 may synchronize the upper data <15:0> and drive the output terminal (for example, the data pad DQ) to output the synchronized data at a second time point. For example, the first driver 771 may synchronize the lower data <7:0> at a rising edge of a predetermined clock (for example, RE clock), and the second driver 772 may synchronize the upper data <15:8> at a falling edge of the predetermined clock. That is, the first driver 771 may receive the second-size lower data <7:0> included in the first serial output data DOUT_B02<15:0>, and output the lower data <7:0> as output data DOUT_R_B02<7:0> at a first edge of the predetermined clock. Similarly, the second driver 772 may receive the second-size upper data <15:8> included in the first serial output data DOUT_B02<15:0>, and output the upper data <15:8> as output data DOUT_F_B02<15:8> at a second edge of the predetermined clock.

Among the second serial output data DOUT_B13<15:0> outputted from the second latch circuit 762, the lower data <7:0> and the upper data <15:8> may be outputted to the output terminal through third and fourth drivers 773 and 774 of the output drivers 770, respectively. The third driver 773 may synchronize the lower data <7:0> and drive the output terminal (for example, the data pad DQ) to output the synchronized data at the first time point, and the fourth driver 774 may synchronize the upper data <15:8> and drive the output terminal (for example, the data pad DQ) to output the synchronized data at the second time point. For example, the third driver 773 may synchronize the lower data <7:0> at a rising edge of the predetermined clock (for example, RE clock), and the fourth driver 774 may synchronize the upper data <15:8> at a falling edge of the predetermined clock. That is, the third driver 773 may receive the second-size lower data <7:0> included in the second serial output data DOUT_B13<15:0>, and output the lower data <7:0> as output data DOUT_R_B13<7:0> at the first edge of the predetermined clock. Similarly, the fourth driver 774 may receive the second-size upper data <15:8> included in the second serial output data DOUT_B13<15:0>, and output the upper data <15:8> as output data DOUT_F_B13<15:8> at the second edge of the predetermined clock.

Figure 8:
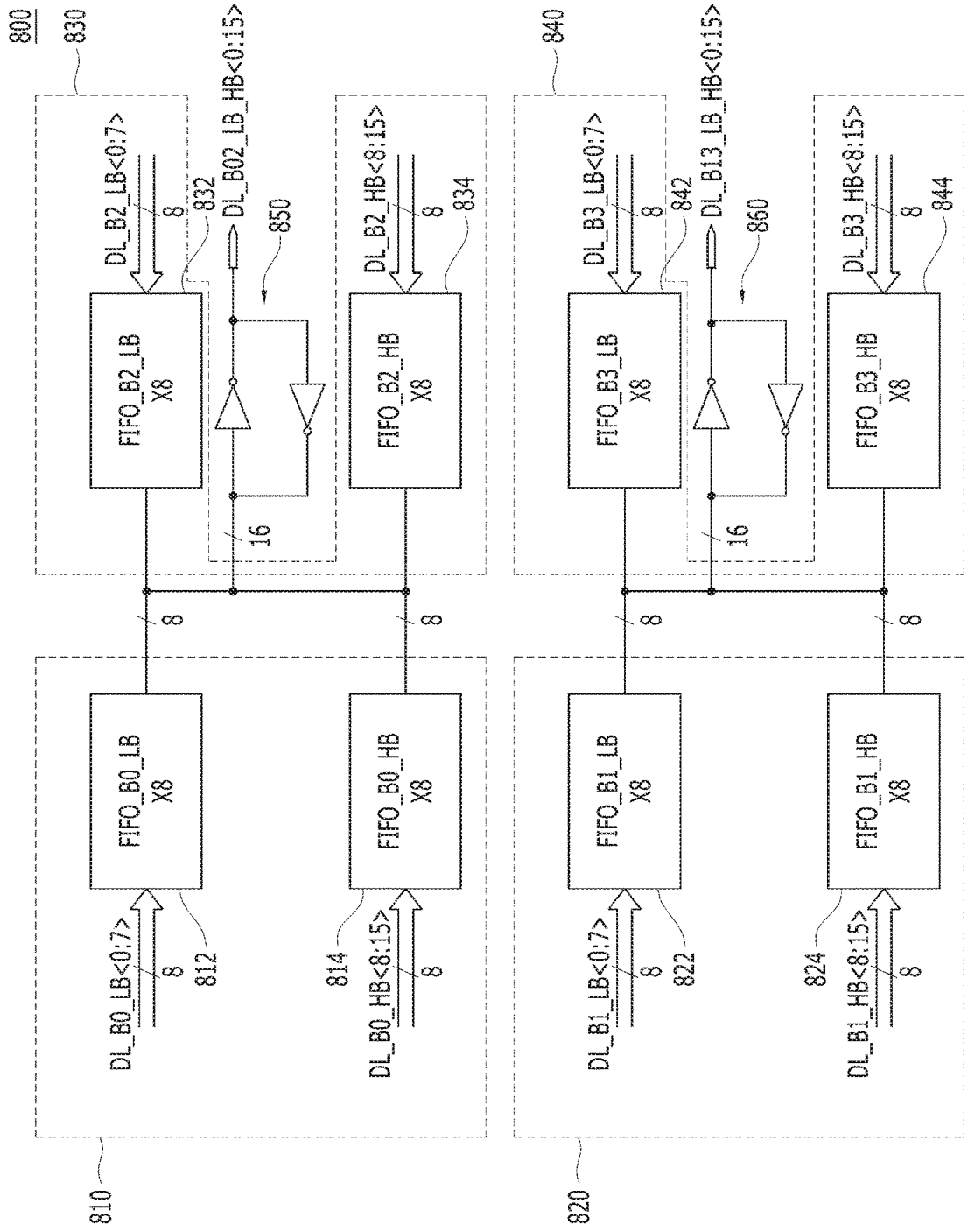
FIG. 8 is a schematic block diagram illustrating a serializer in accordance with an embodiment.

FIG. 8 illustrates a serializer device 800 in accordance with an embodiment.

Referring to FIG. 8, the serializer device 800 may include a plurality of serializers 810 to 840 and latch circuits 850 and 860. For example, the serializers 810 to 840 may correspond to the serializers 751 to 754 illustrated in FIG. 7, respectively, and the latch circuits 850 and 860 may correspond to the latch circuits 761 and 762 illustrated in FIG. 7, respectively.

The first serializer 810 may include a first FIFO circuit 812 and a second FIFO circuit 814. The first FIFO circuit 812 may receive second-size (for example, 8 bits) lower data DL_B0_LB<0:7> included in first-size (for example, 16 bits) first parallel data DL_B0<0:15>, store the received data according to the FIFO method, and then output the stored data as first serial data DL_B0_LB<0:7>. The second FIFO circuit 814 may receive second-size (for example, 8 bits) lower data DL_B0_HB<8:15> included in the first-size (for example, 16 bits) first parallel data DL_B0<0:15>, store the received data according to the FIFO method, and output the stored data as second serial data DL_B0_HB<8:15>.

The third serializer 830 may include a first FIFO circuit 832 and a second FIFO circuit 834. The first FIFO circuit 832 may receive second-size (for example, 8 bits) lower data DL_B2_LB<0:7> included in first-size (for example, 16 bits) first parallel data DL_B2<0:15>, store the received data according to the FIFO method, and then output the stored data as first serial data DL_B2_LB<0:7>. The second FIFO circuit 834 may receive second-size (for example, 8 bits) upper data DL_B2_HB<8:15> included in the first-size (for example, 16 bits) first parallel data DL_B2<0:15>, store the received data according to the FIFO method, and output the stored data as second serial data DL_B2_HB<8:15>.

The first latch circuit 850 may latch the output of the first serializer 810 and the output of the third serializer 830, and output first-size first serial output data DL_B02_LB_HB<0:15>.

The second serializer 820 may include a first FIFO circuit 822 and a second FIFO circuit 824. The first FIFO circuit 822 may receive second-size (for example, 8 bits) lower data DL_B1_LB<0:7> included in first-size (for example, 16 bits) first parallel data DL_B1<0:15>, store the received data according to the FIFO method, and then output the stored data as first serial data DL_B1_LB<0:7>. The second FIFO circuit 824 may receive second-size (for example, 8 bits) upper data DL_B1_HB<8:15> included in the first-size (for example, 16 bits) first parallel data DL_B1<0:15>, store the received data according to the FIFO method, and the output the stored data as second serial data DL_B1_HB<8:15>.

The fourth serializer 840 may include a first FIFO circuit 842 and a second FIFO circuit 844. The first FIFO circuit 842 may receive second-size (for example, 8 bits) lower data DL_B3_LB<0:7> included in first-size (for example, 16 bits) first parallel data DL_B3<0:15>, store the received data according to the FIFO method, and then output the stored data as first serial data DL_B3_LB<0:7>. The second FIFO circuit 844 may receive second-size (for example, 8 bits) upper data DL_B3_HB<8:15> included in the first-size (for example, 16 bits) first parallel data DL_B3<0:15>, store the received data according to the FIFO method, and then output the stored data as second serial data DL_B3_HB<8:15>.

The second latch circuit 860 may latch the output of the second serializer 820 and the output of the fourth serializer 840, and output first-size second serial output data DL_B13_LB_HB<0:15>.

Figure 9:
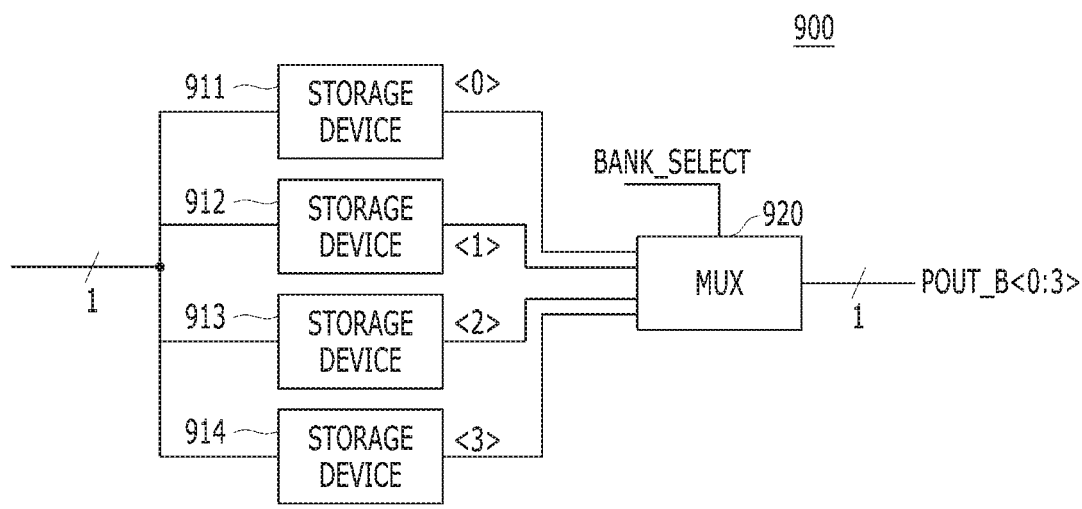
FIG. 9 is a block diagram illustrating a unit first-in first-out (FIFO) circuit in accordance with an embodiment.

FIG. 9 illustrates a unit FIFO circuit 900 in accordance with an embodiment. For example, the unit FIFO circuit 900 may correspond to any one of the FIFO circuits 812, 814, 822, 824, 832, 834, 842 and 844 which are included in the serializers 810 to 840 included in the serializer device 800 illustrated in FIG. 8.

Referring to FIG. 9, the unit FIFO circuit 900 may include a plurality of storage devices 911 to 914 and a multiplexer (MUX) 920 serving as a selector. The plurality of storage devices 911 to 914 may be coupled in parallel to store input data, and have a storage region with a predetermined capacity. In various embodiments, the plurality of storage devices 911 to 914 may have a storage region with a capacity of 16, and each of the storage devices 911 to 914 may have a storage region with a capacity of 4-bit data.

The storage device 911 may receive 1-bit data, and output output data QOUTB_INT<0>. The storage device 912 may receive 1-bit data, and output output data QOUTB_INT<1>. The storage device 913 may receive 1-bit data, and output output data QOUTB_INT<2>. The storage device 914 may receive 1-bit data, and output output data QOUTB_INT<3>.

The multiplexer 920 may select the output of any one storage device among the plurality of storage devices 911 to 914. In various embodiments, the multiplexer 920 may be coupled to the plurality of storage devices 911 to 914 so as to receive the outputs of the storage devices 911 to 914, select any one of the outputs of the storage devices 911 to 914 in response to a bank select signal BANK_SELECT, and output the selected output as data POUT_B<0:3>.

Figure 10:
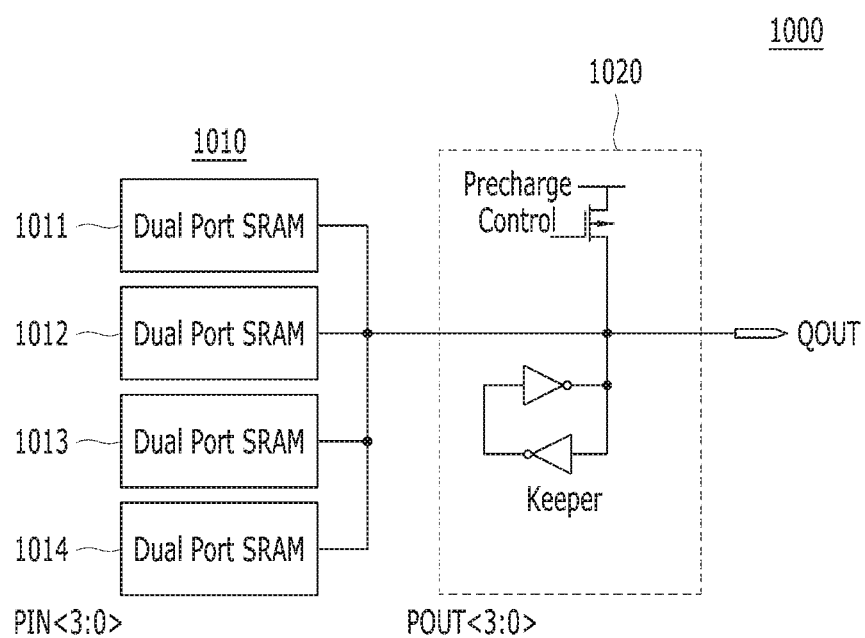
FIG. 10 is a schematic block diagram illustrating a storage device in accordance with an embodiment.

FIG. 10 illustrates a storage device 1000 in accordance with an embodiment. For example, the storage device 1000 may correspond to any one of the plurality of storage devices 911 to 914 illustrated in FIG. 9.

Referring to FIG. 10, the storage device 1000 may include a plurality of dual port static random access memories (SRAMs) 1010 and an output circuit 1020. In various embodiments, the plurality of dual port SRAMs 1010 may include four dual port SRAMs 1011 to 1014. The plurality of dual port SRAMs 1010 may receive input data PIN<3:0>, store the received data, and output the stored data as output data POUT<3:0>.

The output circuit 1020 may control the output data POUT<3:0> from the plurality of dual port SRAMs 1010 such that an output of the output data POUT<3:0> is maintained after precharge. For this operation, the output circuit 1020 may include a transistor as a component for a precharge operation and a keeper as a component for keeping an output of the output data, the keeper including two inverters coupled to each other in a latch type.

Figure 11:
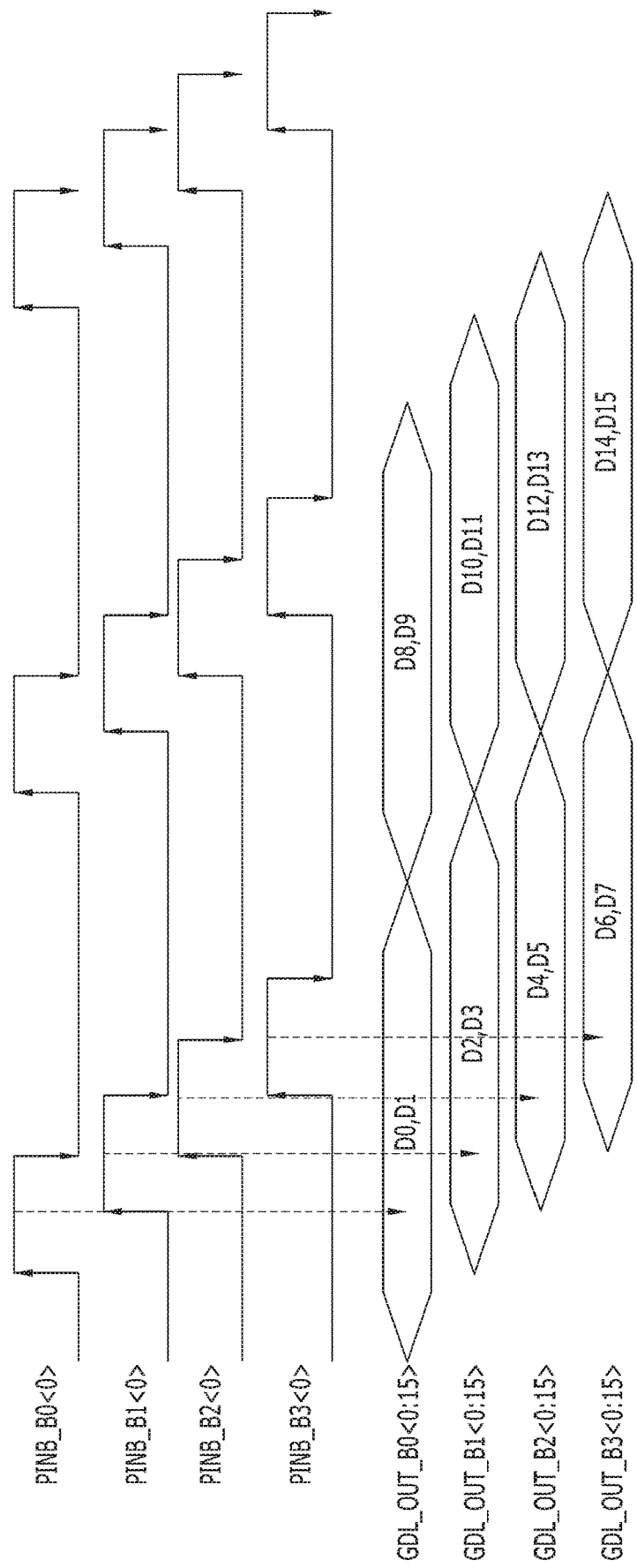
FIG. 11 a timing diagram illustrating input timings of a serializer device in accordance with an embodiment.

FIG. 11 illustrates input timings of the serializer device in accordance with the present embodiment. For example, the timings illustrated in FIG. 11 may indicate timings for data inputted to the serializers 750 included in the data output device 700 illustrated in FIG. 7.

Referring to FIG. 11, GDL_OUT_B0<0:15> represents input data of the serializer 751 of FIG. 7, GDL_OUT_B1<0:15> represents input data of the serializer 752 of FIG. 7, GDL_OUT_B2<0:15> represents input data of the serializer 753 of FIG. 7, and GDL_OUT_B3<0:15> represents input data of the serializer 754 of FIG. 7.

The input timings for the data may be controlled by control signals PINB_B0<0>, PINB_B1<0>, PINB_B2<0> and PINB_B3<0>. In response to the control signal PINB_B0<0>, the data GDL_OUT_B0<0:15> may be inputted to the serializer 751. In response to the control signal PINB_B1<0>, the data GDL_OUT_B1<0:15> may be inputted to the serializer 752. In response to the control signal PINB_B2<0>, the data GDL_OUT_B2<0:15> may be inputted to the serializer 753. In response to the control signal PINB_B3<0>, the data GDL_OUT_B3<0:15> may be inputted to the serializer 754. The control signals PINB_B0<0>, PINB_B1<O>, PINB_B2<0> and PINB_B3<0> may be generated by the output control circuits 730 illustrated in FIG. 7.

Data D0 and D1 included in the data GDL_OUT_B0<0:15> may be outputted from the memory bank 0. Data D2 and D3 included in the data GDL_OUT_B1<0:15> may be outputted from the memory bank 1. Data D4 and D5 included in the data GDL_OUT_B2<0:15> may be outputted from the memory bank 2. Data D6 and D7 included in the data GDE_OUT_B3<0:15> may be outputted from the memory bank 3. Data D8 and D9 included in the data GDL_OUT_B0<0:15> may be outputted from the memory bank 0. Data D10 and D11 included in the data GDL_OUT_B1<0:15> may be outputted from the memory bank 1. Data D12 and D13 included in the data GDL_OUT_B2<0:15> may be outputted from the memory bank 2. Data D14 and D15 included in the data GDL_OUT_B3<0:15> may be outputted from the memory bank 3.

Figure 12:
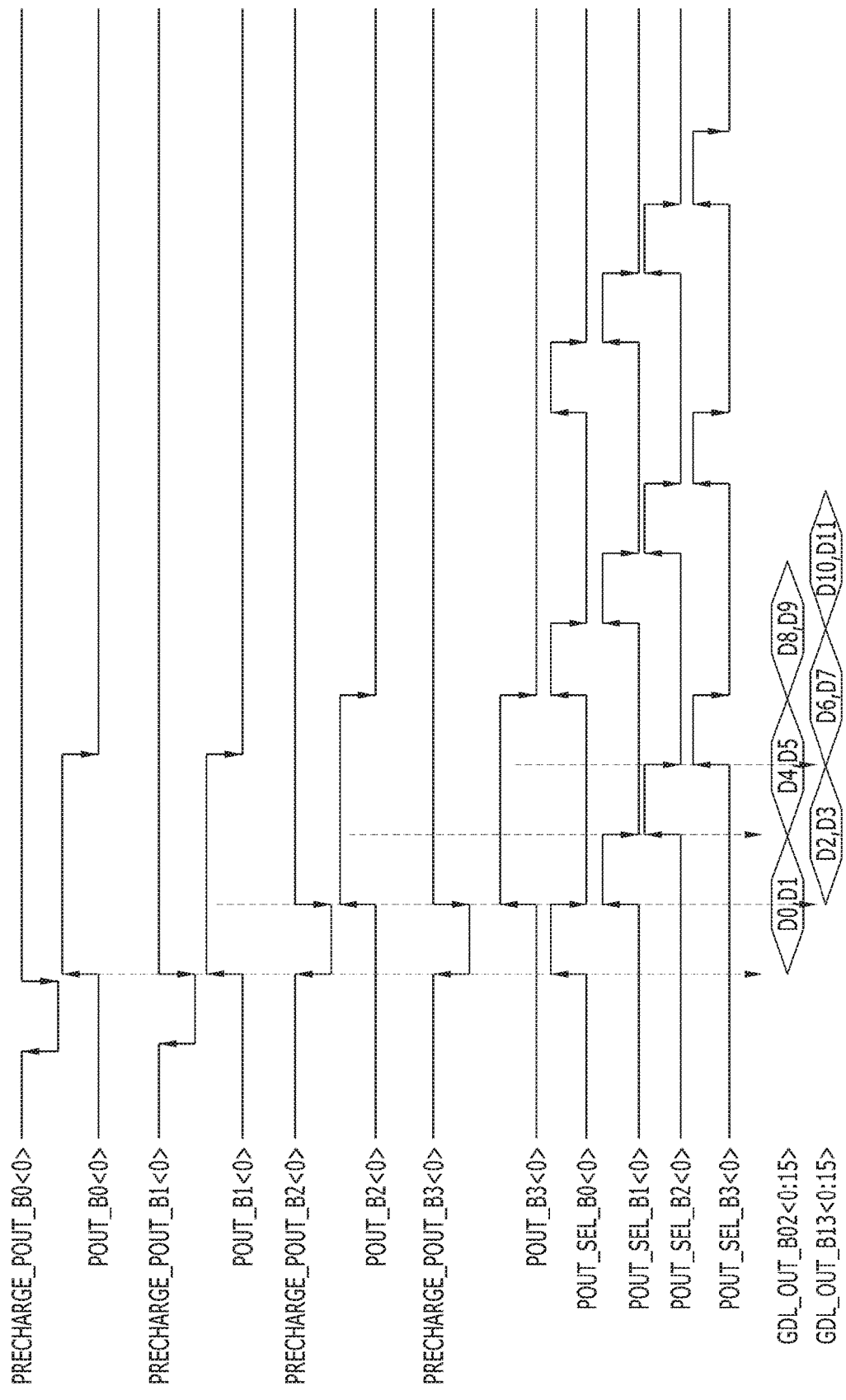
FIG. 12 a timing diagram illustrating output timings of the serializer device in accordance with the present embodiment.

FIG. 12 illustrates output timings of the serializer device in accordance with the present embodiment. For example, the timings illustrated in FIG. 12 may indicate timings for data outputted from the latch circuits 760 illustrated in FIG. 7 or the latch circuits 850 and 860 illustrated in FIG. 8, when the serializers 750 illustrated in FIG. 7 or the serializer device 800 illustrated in FIG. 8 include the unit FIFO circuit 900 illustrated in FIG. 9 and the storage device 1000 illustrated in FIG. 10.

Referring to FIG. 12, precharge control signals PRECHARGE_POUT_B0<0>, PRECHARGE_POUT_B1<0>, PRECHARGE_POUT_B2<0> and PRECHARGE_POUT_B3<0> may be provided to the output circuit 1020 illustrated in FIG. 10. The precharge control signals are signals for controlling output data from the plurality of dual port SRAMs 1010 illustrated in FIG. 10 such that the output data are outputted after precharge. In response to the precharge control signal PRECHARGE_POUT_B0<0>, the output data POUT_B0<0> from the dual port SRAMs 1010 may be outputted after precharge. In response to the precharge control signal PRECHARGE_POUT_B1<0>, the output data POUT_B1<0> from the dual port SRAMs 1010 may be outputted after precharge. In response to the precharge control signal PRECHARGE_POUT_B2<0>, the output data POUT_B2<0> from the dual port SRAMs 1010 may be outputted after precharge. In response to the precharge control signal PRECHARGE_POUT_B3<0>, the output data POUT_B3<0> from the dual port SRAMs 1010 may be outputted after precharge.

The output data POUT_B0<0>, POUT_B1<0>, POUT_B2<0> and POUT_B3<0> may be outputted from the storage devices 911 to 914 illustrated in FIG. 9. The output data POUT_B0<0>, POUT_B1<0>, POUT_B2<0>and POUT_B3<0> may be outputted in response to the control signals POUT_SEL_B0<0>, POUT_SEL_B1<0>, POUT_SEL_B2<0> and POUT_SEL_B3<0>, respectively. The control signals POUT_SEL_B0<0>, POUT_SEL_B1<0>, POUT_SEL_B2<0> and POUT_SEL_B3<0> may correspond to the bank select signal BANK_SELECT illustrated in FIG. 9.

GDL_OUT_B02<0:15> and GDL_OUT_B13<0:15> represent data outputted from the latch circuits 760 illustrated in FIG. 7 or the latch circuits 850 and 860 illustrated in FIG. 8. The output data may be outputted when the output data POUT_B0<0>, POUT_B1<0>, POUT_B2<0> and POUT_B3<0> and the control signals POUT_SEL_B0<0>, POUT_SEL B1<0>, POUT_SEL_B2<0> and POUT_SEL_B3<0> are all at a logic high level.

Data D0 and D1 included in the data GDL_OUT_B02<0:15> may be outputted from the memory bank 0. Data D2 and D3 included in the data GDL_OUT_B13<0:15> may be outputted from the memory bank 1. Data D4 and D5 included in the data GDL_OUT_B02<0:15> may be outputted from the memory bank 2. Data D6 and D7 included in the data GDL_OUT_B13<0:15> may be outputted from the memory bank 3. Data D8 and D9 included in the data GDL_OUT_B02<0:15> may be outputted from the memory bank 0. Data D10 and D11 included in the data GDL_OUT_B13<0:15> may be outputted from the memory bank 1. Such output data may be outputted through the output terminal of the data pad DQ as described above.

Figure 13:
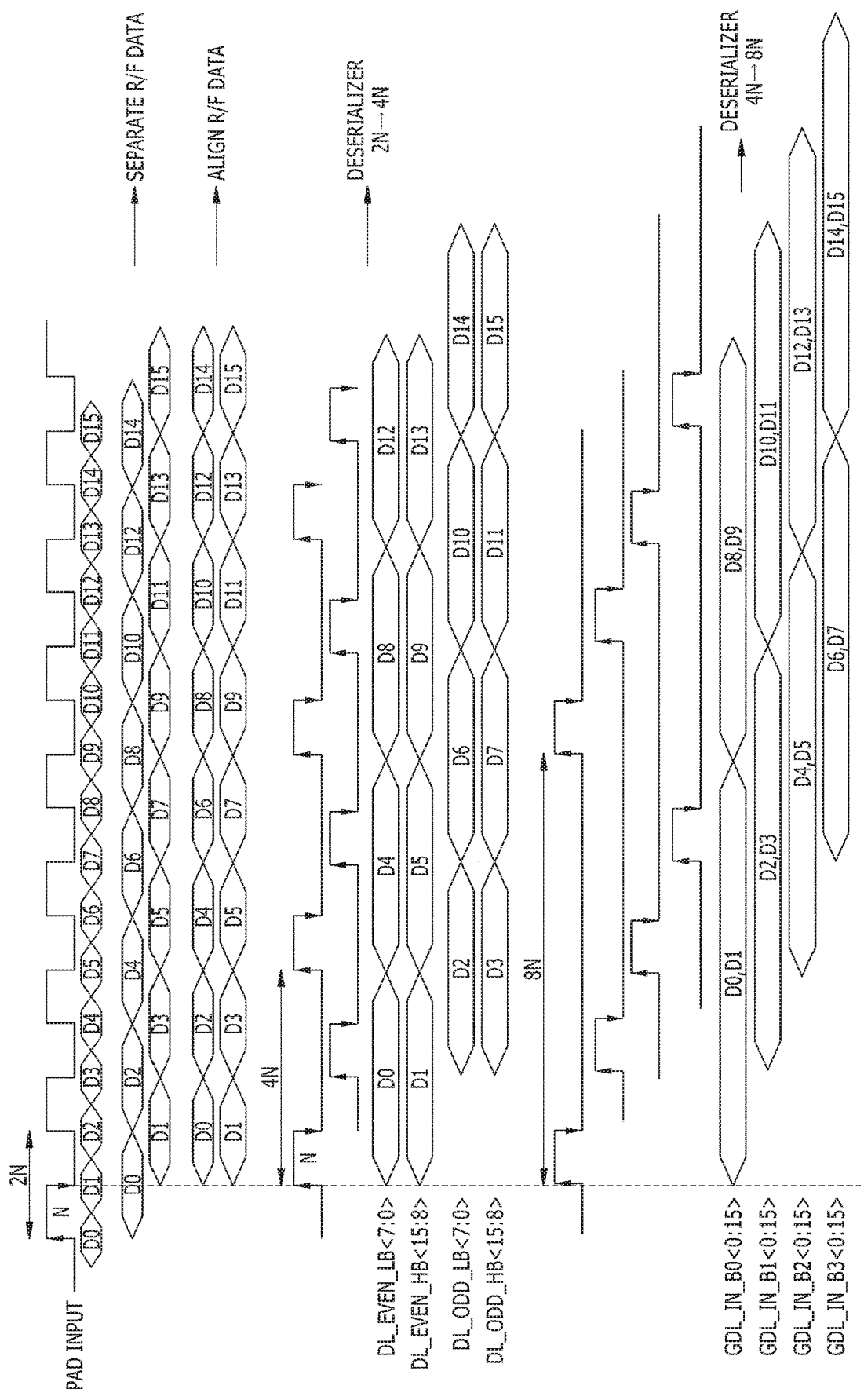
FIG. 13 a timing diagram illustrating data input timings of the memory device in accordance with the present embodiment.

FIG. 13 illustrates data input timings of the memory device in accordance with the present embodiment. For example, the timings illustrated in FIG. 13 may include timings at which data to be written to a specific storage region (for example, a memory bank) of the memory device are inputted and processed.

Referring to FIG. 13, data D0 to D15 inputted through the data pad DQ may be separated into two groups of odd data and even data, and then arranged. That is, the input data D0 to D15 may be separated into the data D0, D2, D4, D6 . . . D14 at rising edges of a specific clock and the data D1, D3, D5, D7 . . . D15 at falling edges of the specific clock, and then arranged.

Then, 2N-size data may be deserialized into 4N-size data. Therefore, data DL_EVEN_LB<7:0>, DL_EVEN_HB<15:8>, DL_ODD_LB<7:0> and DL_ODD_HB<15:8> may be generated.

Then, the 4N-size data may be deserialized into 8N-size data. Therefore, data GDL_IN_B0<0:15>, GDL_IN_B1<0:15>, GDL_IN_B2<0:15> and GDL_IN_B3<0:15> may be generated.

Figure 14:
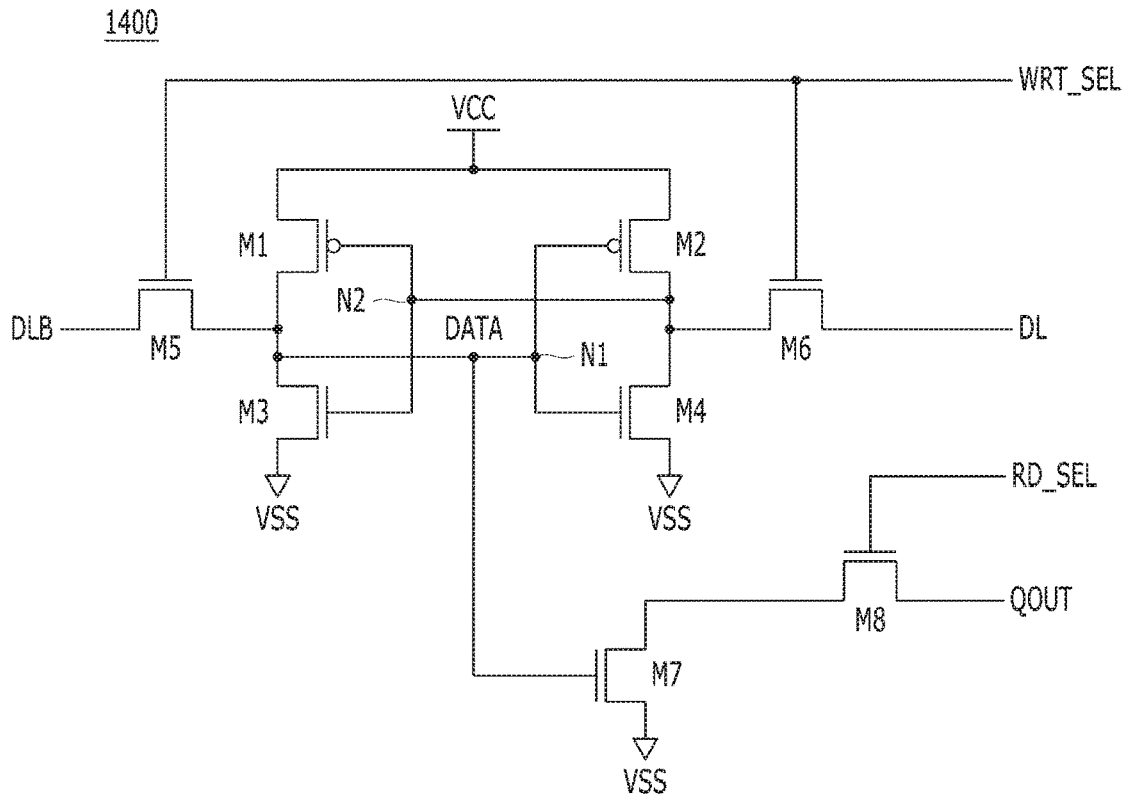
FIG. 14 is a circuit diagram illustrating a dual port static random access memory (SRAM) cell in accordance with embodiments.

FIG. 14 illustrates a dual port static random access memory (SRAM) cell 1400 in accordance with embodiments. For example, the dual port SRAM cell 1400 may correspond to any one of the dual port SRAMs 1011, 1012, 1013 and 1014 illustrated in FIG. 10.

Referring to FIG. 14, the dual port SRAM cell 1400 may include transistors M1 to M8. The transistors M1 to M4 may constitute a storage circuit having nodes N1 and N2. The transistors M5 and M6 may constitute a write port circuit coupled to the nodes N1 and N2. The transistors M7 and M8 may constitute a read port circuit coupled to the nodes N1 and N2. In various embodiments, the transistors M1 and M2 may be implemented with PMOS transistors, and the transistors M3 to M8 may be implemented with NMOS transistors.

The transistors M1 and M3 of the storage circuit may be coupled between a supply voltage terminal VCC and a ground terminal VSS. The transistor M1 may include a first terminal (for example, source) coupled to the supply voltage terminal VCC, a second terminal (for example, gate) and a third terminal (for example, drain). The transistor M3 may include a first terminal (for example, drain) coupled to the third terminal of the transistor M1, a second terminal (for example, gate) coupled to the second terminal of the transistor M1, and a third terminal (for example, source) coupled to the ground terminal VSS. The second terminal of the transistor M1 and the second terminal of the transistor M3 may be coupled to the node N1. The third terminal of the transistor M1 and the first terminal of the transistor M3 may be coupled to the node N2.

The transistors M2 and M4 may be coupled between the supply voltage terminal VCC and the ground terminal VSS. The transistor M2 may include a first terminal (for example, source) coupled to the supply voltage terminal VCC, a second terminal (for example, gate) and a third terminal (for example, drain). The transistor M4 may include a first terminal (for example, drain) coupled to the third terminal of the transistor M2, a second terminal (for example, gate) coupled to the second terminal of the transistor M2, and a third terminal (for example, source) coupled to the ground terminal VSS. The second terminal of the transistor M2 and the second terminal of the transistor M4 may be coupled to the node N2. The third terminal of the transistor M2 and the first terminal of the transistor M4 may be coupled to the node N1.

The third terminal of the transistor M2 and the first terminal of the transistor M4 may be coupled to the node N1 to which the second terminal of the transistor M1 and the second terminal of the transistor M3 are coupled. The third terminal of the transistor M1 and the first terminal of the transistor M3 may be coupled to the node N2 to which the second terminal of the transistor M2 and the second terminal of the transistor M4 are coupled.

The transistors M1 and M3 may form one inverter, and the transistors M2 and M4 may form another inverter. That is, the transistors M1 to M4 may form a latch including two cross-coupled inverters.

The third terminal of the transistor M1 and the first terminal of the transistor M3 may be coupled to form the data node N1. The third terminal of the transistor M2 and the first terminal of the transistor M4 may be coupled to form the data node N2.

The transistor M5 of the write port circuit may function as a pass gate between the node N1 and a data line DLB, and the transistor M6 may function as a pass gate between the node N2 and a data line DL.

The transistor M5 may include a first terminal (for example, source), a second terminal (for example, gate) and a third terminal (for example, drain). The first terminal of the transistor M5 may be coupled to the node N1. The second terminal of the transistor M5 may be coupled to a line WRT_SEL. The third terminal of the transistor M5 may be coupled to the data line DLB. The transistor M6 may include a first terminal (for example, source), a second terminal (for example, gate) and a third terminal (for example, drain). The first terminal of the transistor M6 may be coupled to the node N2. The second terminal of the transistor M6 may be coupled to the line WRT_SEL. The third terminal of the transistor M6 may be coupled to the data line DL.

In various embodiments, the data line pair DL and DLB may correspond to a write bit line, and the line WRT_SEL may correspond to a write word line. For example, when a memory cell array includes a plurality of memory cells having the same configuration as the SRAM cell 1400, the bit line pair BLB and BL for write may be coupled to the drains of the transistors M5 and M6 of a memory cell within a column of the memory cell array, and the word line WL for write may be coupled to the gates of the transistors M5 and M6 of a memory cell within a row of the memory cell array.

During a write operation of the SRAM cell 1400, data to be written to the SRAM cell 1400 may be applied to the data line pair DL and DLB. When the line WRT_SEL is enabled, the transistors M5 and M6 may be turned on. Thus, the data of the data line pair DL and DLB may be transferred and written to the nodes N1 and N2 included in the storage circuit.

The transistors M7 and M8 of the read port circuit may function as a pass gate between a data line QOUT and the node N1 of the storage circuit.

The transistor M7 may include a first terminal (for example, drain), a second terminal (for example, gate) and a third terminal (for example, source). The second terminal of the transistor M7 may be coupled to the node N1. The third terminal of the transistor M7 may be coupled to the ground terminal VSS. The transistor M8 may include a first terminal (for example, source), a second terminal (for example, gate) and a third terminal (for example, drain). The first terminal of the transistor M8 may be coupled to the first terminal of the transistor M7. The second terminal of the transistor M8 may be coupled to a line RD_SEL. The third terminal of the transistor M8 may be coupled to the data line QOUT.

In various embodiments, the data line QOUT may serve as a read bit line, and the line RD_SEL may serve as a read word line. For example, when the memory cell array includes a plurality of memory cells having the same configuration as the SRAM cell 1400, a bit line BL for read may be coupled to the drain of the transistor M8 of a memory cell within a column of the memory cell array, and a word line WL for read may be coupled to the gate of the transistor M8 of a memory cell within a row of the memory cell array.

During a read operation of the SRAM cell 1400, the data line QOUT may be charged with a specific level (for example, logic "1" or "high (H)"). When the line RD_SEL is enabled, the transistor M8 may be turned on. The data stored in the node N1 may turn on or off the transistor M7. For example, when a high-level value is stored in the node N1, the transistor N7 may be turned on. Therefore, the turned-on transistors M7 and M8 may induce the data line QOUT to have a reference voltage VSS or a low-level logical value of the source terminal of the transistor M7, the data line QOUT serving as a read bit line. That is, the transistors M7 and M8 may perform a pulling operation.

On the other hand, when a low-level value is stored in the node N1, the transistor N7 may be turned off and thus operate as an open circuit. Therefore, the data line QOUT serving as a read bit line may retain the high-level value with which the data line QOUT was charged. As such, the level value of the data line QOUT may be sensed to detect the logical value of the data written in the node N1 of the storage circuit.

Figure 15:
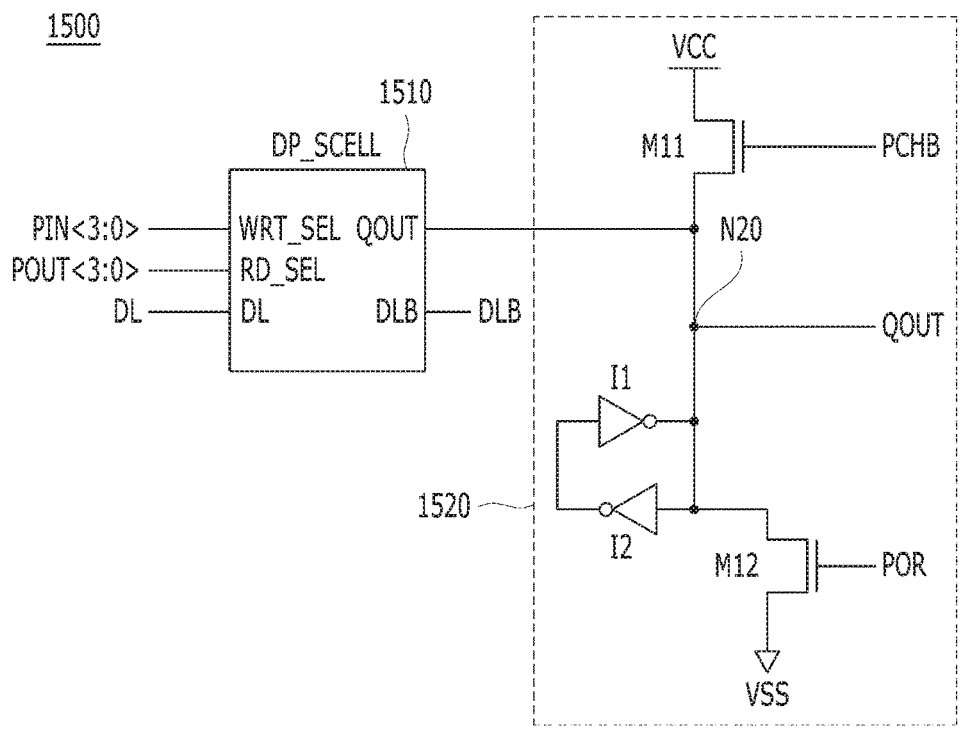
FIG. 15 is a schematic circuit diagram illustrating a storage device in accordance with embodiments.

FIG. 15 illustrates a storage device 1500 in accordance with embodiments. For example, the storage device 1500 may correspond to the storage device 1000 illustrated in FIG. 10.

Referring to FIG. 15, the storage device 1500 may include a dual port SRAM cell chip DP_SCELL 1510 and an output circuit 1520. The dual port SRAM cell chip DP_SCELL 1510 may include a plurality of dual port SRAM cells (for example, four dual port SRAM cells), and each of the dual port SRAM cells may have the structure illustrated in FIG. 14.

The dual port SRAM cell chip DP_SCELL 1510 may include terminals coupled to the data line pair DL and DLB, a terminal coupled to the data line QOUT, a terminal coupled to receive a write control signal WRT_SEL, and a terminal coupled to receive a read control signal RD_SEL. In response to the write control signal WRT_SEL, the dual port SRAM cell chip DP_SCELL 1510 may write data PIN<3:0> to storage nodes therein (for example, the nodes N1 and N2 of FIG. 14). In response to the read control signal RD_SEL, the dual port SRAM cell chip DP_SCELL 1510 may read data POUT<3:0> written in storage nodes thereof (for example, the nodes N1 and N2 of FIG. 14), and output the read data.

The input/output circuit 1520 may include transistors M11 and M12 and inverters I1 and I2. The transistor M11 may include first to third terminals. The first terminal of the transistor M11 may be coupled to a supply voltage terminal VCC. The second terminal of the transistor M11 may be coupled to receive a signal PCHB. The third terminal of the transistor M11 may be coupled to a data node N20. In various embodiments, the signal PCHB may indicate a control signal for turning on the transistor M11. According to the signal PCHB, data may be outputted after the dual port SRAM cell chip DP_SCELL 1510 is precharged. The signal PCHB may correspond to the precharge signal illustrated in FIG. 10 and the precharge signals PRECHARGE_POUT_B0<0>, PRECHARGE_POUT_B1<0> and PRECHARGE_POUT_B2<0>, PRECHARGE_POUT_B3<0> illustrated in FIG. 12.

The inverters I1 and I2 may include input and output terminals which are complementarily coupled to each other, and function as a latch circuit. That is, the input terminal of the inverter I1 may be coupled to the output terminal of the inverter I2, the output terminal of the inverter I1 may be coupled to the input terminal of the inverter I2, and the output terminal of the inverter I1 and the input terminal of the inverter I2 may be coupled to the data node N20.

The transistor M12 may include first to third terminals. The first terminal of the transistor M12 may be coupled to the data node N20. The second terminal of the transistor M12 may be coupled to receive a signal POR. The third terminal of the transistor M12 may be coupled to the ground voltage terminal VSS. The transistor M12 may be turned on or off in response to the signal POR. As the transistor M12 is turned off, output data applied to the data node N20 may be retained by the latch circuit.

As such, the output circuit 1520 may output data after the dual port SRAM cell chip DP_SCELL 1510 is precharged, and the transistor M12 and the inverters I1 and I2 of the output circuit 1520 may operate as a keeper to keep the output data in the data node N20.

Figure 16:
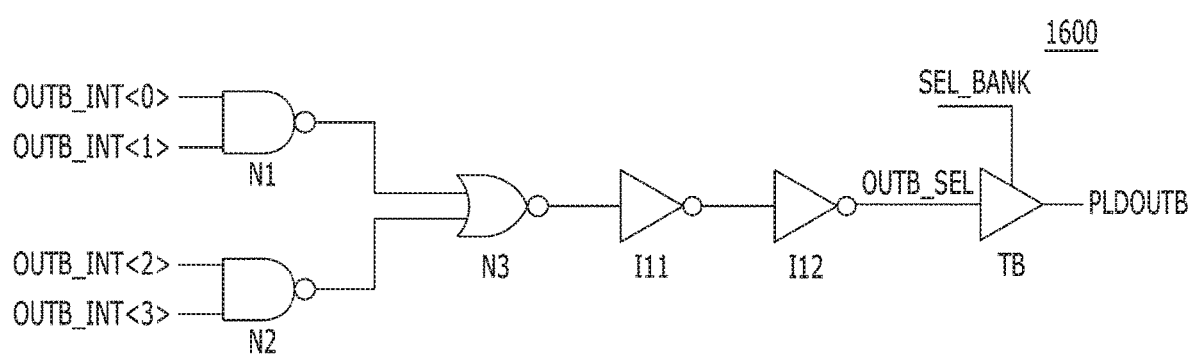
FIG. 16 is a schematic circuit diagram illustrating a selection circuit in accordance with embodiments.

FIG. 16 illustrates a selection circuit 1600 in accordance with embodiments. For example, the selection circuit 1600 illustrated in FIG. 16 may correspond to the multiplexer 920 illustrated in FIG. 9.

Referring to FIG. 16, the selection circuit 160 may include gates N1 to N3, inverters I11 and I12, and a buffer TB.

The gate N1 may include a first input terminal coupled to receive a signal OUTB_INT<0>, a second input terminal coupled to receive a signal OUTB_INT<1>, and an output terminal. The gate N1 may perform a specific operation (for example, NAND operation) on the received signals, and output the operation result through the output terminal. The gate N2 may include a first input terminal coupled to receive a signal OUTB_INT<2>, a second input terminal coupled to receive a signal OUTB_INT<3>, and an output terminal. The gate N2 may perform a specific operation (for example, NAND operation) on the received signals, and output the operation result through the output terminal. The gate N3 may include a first input terminal coupled to the output terminal of the gate N1, a second input terminal coupled to the output terminal of the gate N2, and an output terminal. The gate N3 may perform a specific operation (for example, NOR operation) on the output of the gate N1 and the output of the gate N2, and output the operation result through the output terminal.

The inverter I11 may include an input terminal coupled to the output terminal of the gate N1 and an output terminal. The inverter I11 may perform a specific operation (for example, inverting operation) on the output of the gate N3, and output the operation result through the output terminal. The inverter I12 may include an input terminal coupled to the output terminal of the inverter I11 and an output terminal. The inverter I12 may perform a specific operation (for example, inverting operation) on the output of the inverter I11, and output the operation result through the output terminal. The inverter I12 may output a signal OUTB_SEL.

The buffer TB may include an input terminal coupled to the output terminal of the inverter I11, a control terminal coupled to receive a control signal, and an output terminal. The buffer TB may receive the output of the inverter I12, and output the received signal according to the control signal SEL_BANK. In various embodiments, the buffer TB may select data outputted from the corresponding memory bank according to the bank select control signal SEL_BANK, and output the selected data as output data PLDOUTB.

For example, when the bank select control signal SEL_BANK has a value for selecting a memory bank 0, the buffer TB may output the signal OUTB_SEL corresponding to data outputted from the memory bank 0. When the bank select control signal SEL_BANK has a value for selecting a memory bank 1, the buffer TB may output the signal OUTB_SEL corresponding to data outputted from the memory bank 1. When the bank select control signal SEL_BANK has a value for selecting a memory bank 2, the buffer TB may output the signal OUTB_SEL corresponding to data outputted from the memory bank 2. When the bank select control signal SEL_BANK has a value for selecting a memory bank 3, the buffer TB may output the signal OUTB_SEL corresponding to data outputted from the memory bank 3.

As described above, the present embodiments can provide the serializer with a new structure, which converts parallel data outputted from the cell array included in the memory device into serial data and outputs the serial data, and the data output device including the same.

Although various embodiments have been described for illustrative purposes, it will be apparent to those skilled in the art that various changes and modifications may be made without departing from the spirit and scope of the invention as defined in the following claims.

What is claimed is:

1. A data output device comprising:
    a plurality of storage devices coupled in parallel to store input data, each of the plurality of storage devices having a predetermined multi-bit storage; and
    a selector suitable for selecting an output of any one storage device among the plurality of storage devices, wherein each of the storage devices comprises:
    a plurality of dual port static random access memory (SRAM) cells; and
    an output circuit suitable for outputting data stored in any one SRAM cell of the plurality of SRAM cells after the plurality of SRAM cells are precharged.

2. The data output device of claim 1, wherein each of the dual port SRAM cells comprises:
    a storage circuit comprising one or more nodes for storing data;
    a write port circuit suitable for writing write data inputted to a write data line to the node; and a read port circuit suitable for reading the data stored in the node and outputting the read data to a data output node.

3. The data output device of claim 2, wherein the storage circuit comprises:
a first transistor coupled between a supply voltage terminal and a first storage node;
a second transistor coupled between the supply voltage terminal and a second storage node;
a third transistor coupled between the first storage node and a ground voltage terminal; and
a fourth transistor coupled between the second storage node and the ground voltage terminal.

4. The data output device of claim 3, wherein the write port circuit comprises:
a fifth transistor coupled between a first data line and the first storage node, and suitable for passing data of the first data line to the first storage node in response to a write control signal; and
a sixth transistor coupled between a second data line and the second storage node, and suitable for passing data of the second data line to the second storage node in response to the write control signal.

5. The data output device of claim 4, wherein the read port circuit comprises seventh and eighth transistors coupled between the ground voltage terminal and an output data line, and suitable for passing the data of the first storage node to the output data line in response to a read control signal.

6. The data output device of claim 2, wherein the output circuit comprises:
a latch circuit suitable for latching the read data outputted to the data output node;
a first transistor coupled between a supply voltage terminal and the data output node, and suitable for outputting the read data after the cells are precharged; and
a second transistor coupled between the data output node and the ground voltage terminal, and suitable for maintaining the output of the read data to the data output node.

7. The data output device of claim 6, wherein the latch circuit comprises first and second inverters cross-coupled between the data output node and the second transistor.

8. The memory device of claim 1, wherein the plurality of storage devices have a 16-bit data storage, and
each of the storage devices has a 4-bit data storage.

9. The data output device of claim 8, wherein the plurality of storage devices comprise first to fourth storage devices, and
wherein the selector comprises:
a first gate suitable for performing a NAND operation on an output of the first storage device and an output of the second storage device, and outputting the operation result;
a second gate suitable for performing a NAND operation on an output of the third storage device and an output of the fourth storage device, and outputting the operation result;
a third gate suitable for performing a NOR operation on the output of the first gate and the output of the second gate, and outputting the operation result;
a first inverter suitable for inverting the output of the third gate, and outputting the inverted signal;
a second inverter suitable for inverting the output of the first inverter, and outputting the inverted signal; and
a buffer suitable for outputting the output of the second inverter in response to a memory bank select signal.

10. A memory device comprising:
a plurality of memory banks for storing data;
a first serializer suitable for receiving first parallel data having a first size from a first data line coupled to one memory bank, and selectively outputting first and second serial data each having a second size corresponding to ½ of the first size;
a second serializer suitable for receiving second parallel data having the first size from a second data line coupled to another memory bank, and selectively outputting third and fourth serial data each having the second size; and
a latch circuit suitable for latching the output of the first serializer and the output of the second serializer, and outputting serial output data having the first size,
wherein the first serializer comprises two or more first-in first-out (FIFO) circuit, each including:
a plurality of storage devices coupled in parallel to store input data, each of the plurality of storage devices having a predetermined multi-bit storage; and
a selector suitable for selecting an output of any one storage device among the plurality of storage devices.

11. The memory device of claim 10, wherein each of the storage devices comprises a plurality of dual port SRAMs.

12. The memory device of claim 11, wherein each of the storage devices comprise an output circuit coupled to the plurality of dual port SRAMs.

13. The memory device of claim 12, wherein the output circuit comprises a transistor for a precharge operation and a keeper having two inverters coupled to each other in a latch type.

* * * * *